United States Patent
Li

(10) Patent No.: US 7,233,211 B2
(45) Date of Patent: Jun. 19, 2007

(54) METHOD TO IMPROVE HIGH FREQUENCY DIVIDER BANDWIDTH COVERAGE

(75) Inventor: Qiang (Tom) Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 143 days.

(21) Appl. No.: 11/041,549

(22) Filed: Jan. 24, 2005

(65) Prior Publication Data

US 2006/0119446 A1 Jun. 8, 2006

Related U.S. Application Data

(60) Provisional application No. 60/633,522, filed on Dec. 6, 2004.

(51) Int. Cl.
*H03B 19/00* (2006.01)

(52) U.S. Cl. .............................. 331/74; 331/51; 331/76; 327/115; 327/117

(58) Field of Classification Search ................. 331/51, 331/74, 76; 327/115, 117, 156
See application file for complete search history.

(56) References Cited

U.S. PATENT DOCUMENTS

2002/0097072 A1* 7/2002 Wakada et al. .............. 327/117
2004/0263143 A1* 12/2004 Lee ............................. 323/312

* cited by examiner

*Primary Examiner*—Joseph Chang

(57) ABSTRACT

A divider for a local oscillator (LO) generator system of a phase locked loop (PLL) in a transceiver chip. The divider includes at least one divider unit. Each divider unit includes a frequency divider unit for receiving an input signal having an input frequency and for outputting an output signal having an output frequency which is approximately one half of the input frequency. Each divider unit also includes a resistor bank coupled between a voltage source and the frequency divider unit, and a current stirring unit for supplying current to the frequency divider unit. The resistance of the resistor bank and a magnitude of the current supplied by the current stirring unit are variable depending on the input frequency.

22 Claims, 4 Drawing Sheets

METHOD TO IMPROVE HIGH FREQUENCY DIVIDER BANDWIDTH COVERAGE

CROSS-REFERENCE TO RELATED APPLICATIONS

This application claims priority to and the benefit of U.S. Provisional Patent Application No. 60/633,522 entitled "Method to Improve High Frequency Divider Bandwidth Coverage" filed Dec. 6, 2004, the entire content of which is incorporated by reference herein.

FIELD OF THE INVENTION

The present invention relates to a local oscillation (LO) generator system for a phase locked loop (PLL) in a high frequency transceiver, and more particularly, to a method of improving bandwidth coverage of a divider in the LO generator system.

BACKGROUND

A quad-band Global System for Mobile Communication/General Packet Radio Services (GSM/GPRS) RF transceiver supports relatively high and diverse carrier frequencies of 800 MHz, 900 MHz, 1800 MHz and 1900 MHz used in different regions of the world. A voltage controlled oscillator (VCO) of a PLL in such a transceiver correspondingly has a wide frequency range (e.g., from 3 GHz to 4 GHz). Such a wide frequency range at a high frequency must also be covered by a frequency divider, which is right next to a VCO buffer and receives the output of the VCO buffer as its input.

In a frequency divider for an input signal having a relatively high frequency, relatively large current and small load resistor are typically used to guarantee the speed requirement and output DC level. In a frequency divider for an input signal having a relatively low frequency, relatively small current and large load resistor are typically used to save current and provide correct DC level for the following stage. Hence, a conventional high or low frequency divider is generally not suitable for operation over a wide frequency range.

Therefore, it is desirable to provide a high frequency divider that can operate at both the high and low ends of a wide frequency range of a VCO.

SUMMARY

In an exemplary embodiment of the present invention, a divider for a local oscillator (LO) generator system includes at least one divider unit. Each divider unit includes a frequency divider unit, a resistor bank and a current stirring unit. The frequency divider unit receives an input signal having an input frequency and outputs an output signal having an output frequency which is approximately one half of the input frequency. The resistor bank is coupled between a voltage source and the frequency divider unit, and the current stirring unit supplies current to the frequency divider unit. Resistance of the resistor bank and a magnitude of the current supplied by the current stirring unit are variable depending on the input frequency.

The at least one divider unit can include two divider units that are arranged in series, such that a first one of the divider units receives a signal having a first frequency as the input signal and outputs a signal having a second frequency, which is approximately one half of the first frequency, as the output signal, and a second one of the divider units receives the signal having the second frequency as the input signal, and outputs a signal having a third frequency, which is approximately one half of the second frequency, as the output signal.

In another exemplary embodiment of the present invention, an LO generator system includes a VCO for generating an output corresponding to a control voltage applied thereto, a VCO buffer for receiving the output generated by the VCO and for providing a buffered output, and at least one divider. Each divider has at least one divider unit, and each divider unit includes a frequency divider unit, a resistor bank and a current stirring unit. The frequency divider unit receives an input signal having an input frequency and outputs an output signal having an output frequency which is approximately one half of the input frequency. The resistor bank is coupled between a voltage source and the frequency divider unit, and the current stirring unit supplies current to the frequency divider unit. Resistance of the resistor bank and a magnitude of the current supplied by the current stirring unit are variable depending on the input frequency.

In yet another exemplary embodiment according to the present invention, a method of improving bandwidth coverage in a divider of an LO generator system is provided. The divider has at least one divider unit, and each divider unit includes a frequency divider unit, a resistor bank coupled to the frequency divider unit, and a current stirring unit for supplying current to the frequency divider unit. The frequency divider unit receives an input signal having an input frequency and outputs an output signal having an output frequency which is approximately one half of the input frequency. Resistance of the resistor bank is adjusted based on the input frequency, and a magnitude of the current supplied by the current stirring unit is adjusted based on the input frequency.

These and other aspects of the invention will be more readily comprehended in view of the discussion herein and accompanying drawings.

DETAILED DESCRIPTION

In exemplary embodiments of the present invention, load resistance and current are selected proportionally by the frequency tuning control bits, such that a wide frequency range is covered while saving current on a lower frequency band and providing high speed for a higher frequency band.

Figure 1:
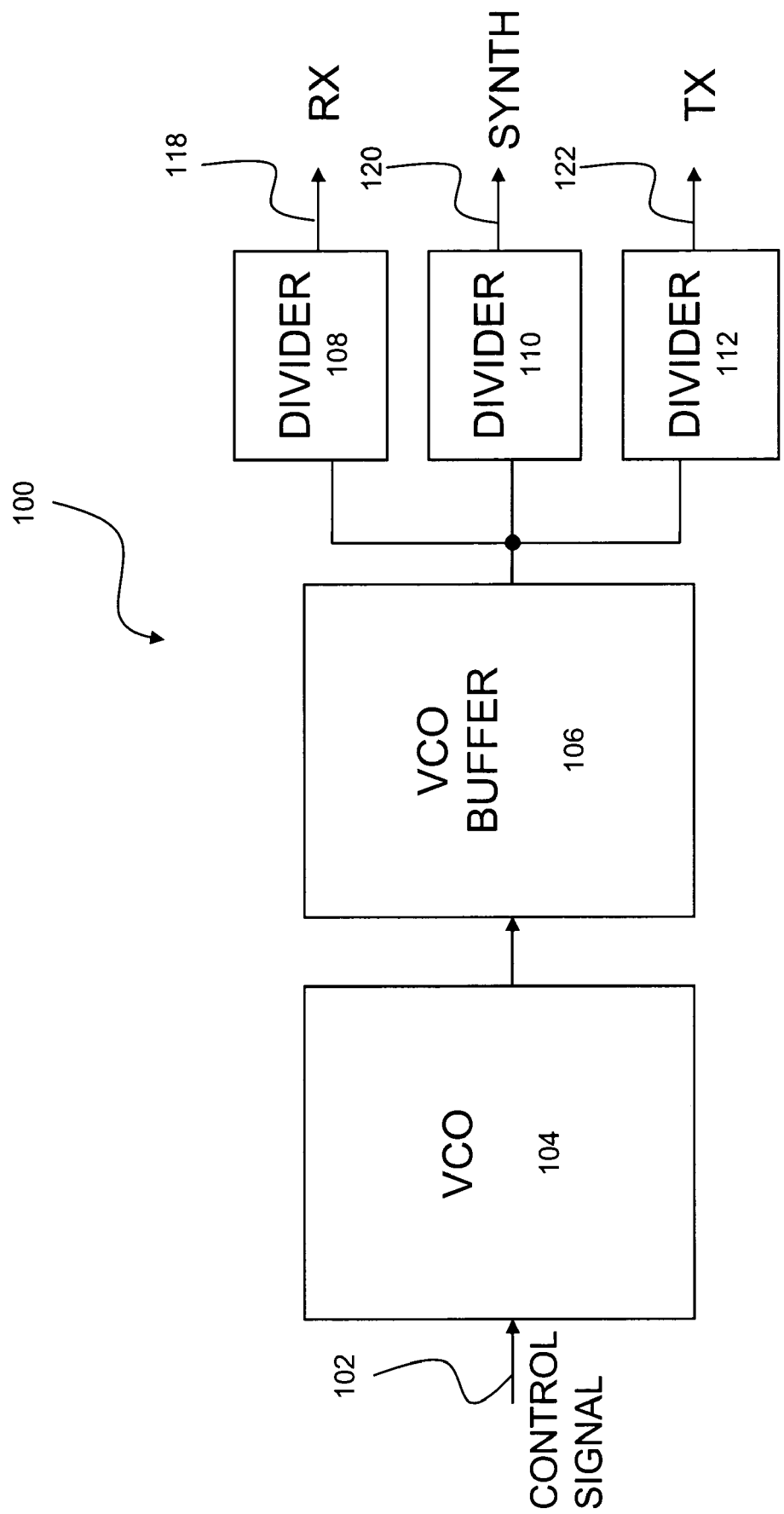
FIG. 1 is a block diagram of a local oscillator (LO) generator system in an exemplary embodiment according to the present invention.

Referring now to FIG. 1, an LO generator system 100 includes a VCO 104, a VCO buffer 106, and a plurality of dividers 108, 110 and 112. The dividers 108, 110 and 112 may be ½ dividers, ¼ dividers or any combination thereof. The LO generator system 100, for example, may be a part of a phase locked loop (PLL) used in a transceiver, such as, for example, a quad-band GSM/GPRS RF transceiver that should operate over a wide range of frequencies (e.g., from 3 GHz to 4 GHz).

The VCO 104 receives a control signal (or a control voltage) 102, which is used to adjust the frequency of its output. The output of the VCO 104 is buffered by the VCO buffer 106 to drive subsequent devices. The output of the VCO buffer 106 (i.e., the buffered output) is provided to the dividers 108, 110 and 112 to be frequency divided and output as a receive (RX) frequency signal 118, a synthesize frequency signal 120 and a transmit frequency signal 122, respectively.

Figure 2:
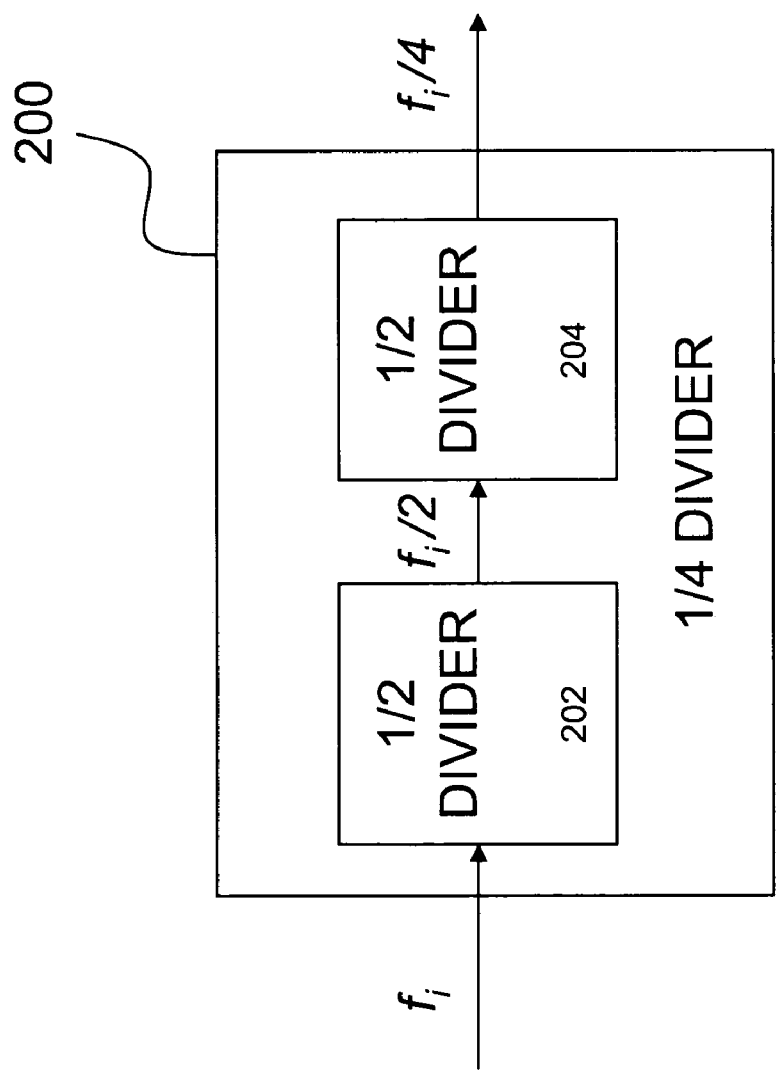
FIG. 2 is a block diagram of a ¼ divider that can be used in the LO generator system of FIG. 1.

Referring now to FIG. 2, a ¼ divider 200 includes a couple of ½ dividers 202 and 204. By arranging the ½ dividers 202 and 204 in series, the frequency dividing capability of the ¼ divider 200 is achieved. As seen in FIG. 2, an input signal having a frequency $f_i$ is received by the first ½ divider 202. The first ½ divider 202 divides the frequency of the input signal by two to generate an output signal having a frequency $f_i/2$. This output signal in turn is provided to the second ½ divider 204, which divides it again to generate an output signal having a frequency (i.e., $f_i/4$) that is one half of the frequency of the output signal of the ½ divider 202.

Figure 3:
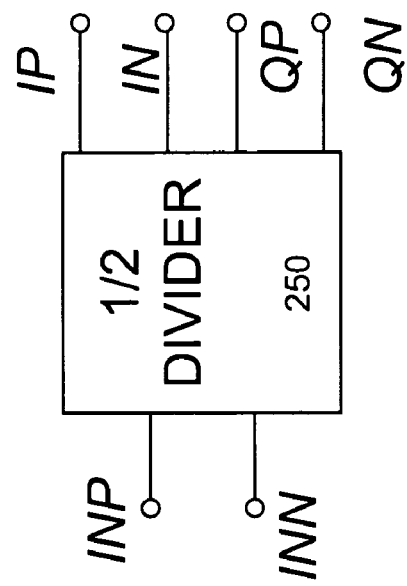
FIG. 3 is a block diagram of a ½ divider that can be used in the ¼ divider of FIG. 2.

Referring now to FIG. 3, in practice a differential divider, such as a ½ divider 250 is often used since the input signal to be frequency divided often includes a pair of differential signals. The ½ divider 250 receives a pair of differential input signals INP and INN, and generates two pairs of differential signals, names, IP, IN and QP, QN. The IP, IN output signals and QP, QN output signals have substantially the same characteristics except that they are out of phase by approximately 90 degrees. In more detail, the IP and IN pair of differential signals lead the QP and QN pair of differential signals by approximately 90 degrees.

Figure 4:
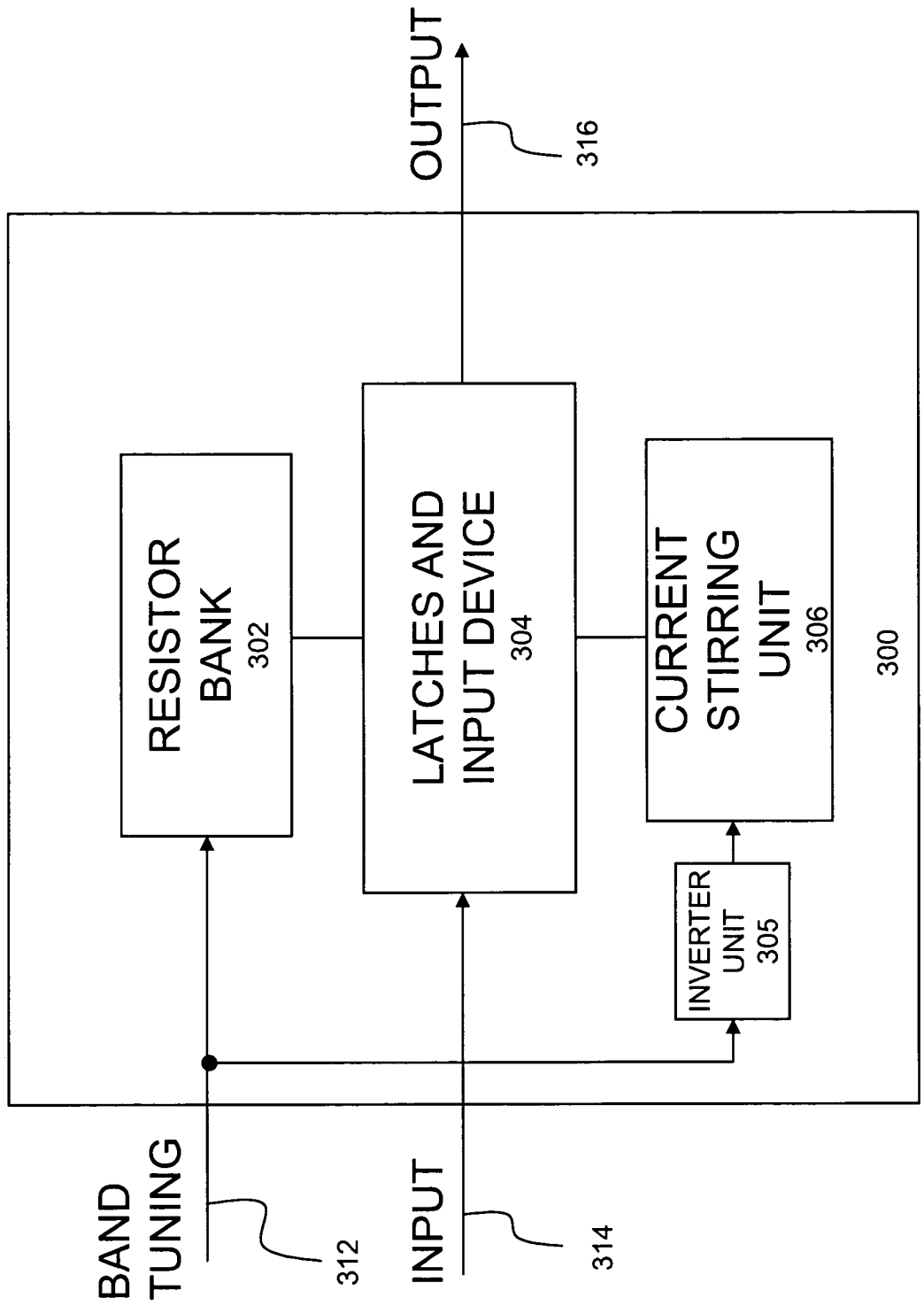
FIG. 4 is a block diagram of a ½ divider that can be used in the ¼ divider of FIG. 2 and/or as the ½ divider of FIG. 3.

A divider 300 of FIG. 4 includes a resistor bank 302, latches and input device 304, an inverter unit 305 and a current stirring unit 306. The divider 300 is a ½ divider (similar to the ½ divider 250 of FIG. 3), two or more of which can be arranged in series to realize output signals 316 having frequencies that are ¼, ⅛, 1/16, etc. of input signals 314. By way of example, in reference to FIG. 3, when the INP and INN input signals have a frequency of approximately 3 GHz, the output signals IP, IN, QP and QN of the ½ divider 250 each have a frequency of approximately 1.5 GHz. Further, when the next stage ½ divider in series is applied the output signals having the frequency of approximately 1.5 GHz as its input signals, the subsequent output signals have a frequency of approximately 0.75 GHz.

For another example, when the INP and INN input signals have a frequency of approximately 4 GHz, the output signals IP, IN, QP and QN of the ½ divider 250 each have a frequency of approximately 2 GHz. Further, when the next stage ½ divider in series is applied the output signals having the frequency of approximately 2 GHz as its input signals, the subsequent output signals have a frequency of approximately 1 GHz.

Since the latches and input device 304 is used to divide the frequency of the input signals to generate the output signals, the latches and input device 304 may also be referred to as a "frequency divider unit".

Returning now to FIG. 4, a multi-bit band tuning signal 312 is provided to the resistor bank 302. The multi-bit band tuning signal 312 is also provided to the current stirring unit 306 after being inverted by the inverter unit 305, which includes a plurality of inverters for inverting the bits of the multi-bit band tuning signal 312. While the same multi-bit band tuning signal 312 is provided to the resistor bank 302 and, after being inverted, to the current stirring unit 306 in FIG. 4, a different set of multi-bit signals may be applied to the resistor bank 302 and the current stirring unit 306 in other embodiments. In such cases, the inverter unit 305 may not be needed.

Such adjusting of the resistance in the resistor bank 302 and the magnitude or amount of current supplied by the current stirring unit 306 is used because of different requirements for the divider 300 to divide input signals having different frequencies over a wide range of frequencies. This is because the divider in the LO generator system that operates over a wide frequency range (e.g., 3 GHz to 4 GHz) should be able to support input signals having the correspondingly wide frequency range.

By way of example, in a high frequency operation, a large current is desired from the current stirring unit 306 to meet the speed requirements. Since such a large current flows through the resistor bank 302, a small load resistance is desired in the resistor bank 302 so as to ensure that the output signal 316 has an acceptable output DC level, since high load resistance may result in an unacceptably high voltage drop across the resistor bank.

On the other hand, in a low frequency operation, the speed requirements are not as critical, and therefore a small current is used to save current, thereby resulting in reduced power consumption. When the current flowing through the resistor bank 302 is small, a relatively large load resistance thereof is desired for a sufficient voltage drop to provide correct DC level for the output signal applied to the following stage.

In view of the above two different requirements for high frequency and low frequency operations, the band tuning signal 312 is applied to the resistor bank 302 and the inverted band tuning signal is applied to the current stirring unit 306 for adjustments based on the frequency of the input signals. The band tuning signal 312, for example, may include an array of binary bits [0:N], where N is an integer greater than or equal to 1. Of course, more precise control over a wide frequency range can be realized as N becomes larger and more bits are used. These bits of the band tuning signal 312 may also be referred to as frequency tuning control bits. In the exemplary embodiments of the present invention, the load resistance and the current magnitude are selected proportionally to the frequency of the input signals by these frequency tuning control bits.

Figure 5:
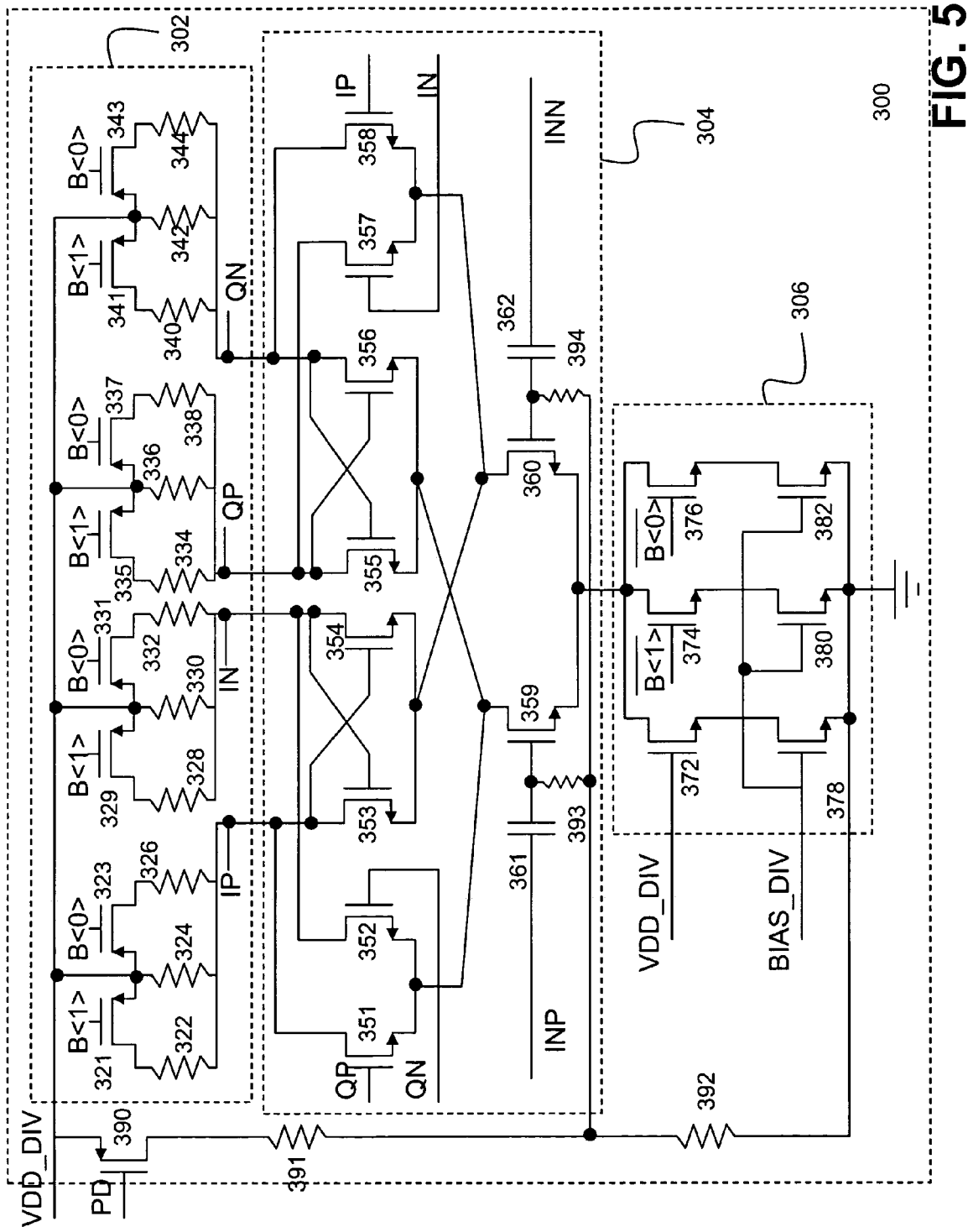
FIG. 5 is a schematic diagram of the ½ divider of FIG. 4.

As can be seen in FIG. 5, the latches and input device 304 includes an input device having a pair of input transistors 359 and 360 and a corresponding pair of latches. The input transistor 359 receives a positive input signal INP through a capacitor 361, and the input transistor 360 receives a negative input signal INN through a capacitor 362. The capacitors 361 and 362 operate as high pass filters for filtering out low frequency components of the respective input signals INP and INN.

The divider 300 includes other components (e.g., the inverter unit 305 of FIG. 4) that are not shown in FIG. 5 since they are not necessary for a complete understanding of the described exemplary embodiments of the present invention. The input transistors 359 and 360, as well as other transistors and other components shown (or not shown) in FIG. 5 are fabricated using CMOS technology, and can readily be integrated on the same integrated circuit chip with other CMOS devices.

The input transistors 359 and 360 are N-channel transistors whose sources are commonly connected to the current stirring unit 306. Gates of the input transistors 359 and 360 are coupled to the input signals INP and INN, respectively, through the capacitors 361 and 362, respectively.

A drain of the input transistor 359 is coupled to sources of transistors 351, 352, 355 and 356, which are N-channel transistors. The transistors 351 and 352 receive a differential pair of output signals QP and QN as inputs to their respective gates, and provide a differential pair of output signals IP and IN that have approximately one half the frequency as that of the input signals INP and INN. By way of example, when multiple dividers are used in series as divider stages, the output signals IP and IN can be used as input signals to the next stage divider. A gate of the transistor 355 is coupled to a drain of the transistor 356, which is also coupled to the output signal QN, and a gate of the transistor 356 is coupled to a drain of the transistor 355, which is also coupled to the output signal QP.

A drain of the input transistor 360 is coupled to sources of transistors 353, 354, 357 and 358, which are N-channel transistors. The transistors 357 and 358 receive the differential pair of output signals IN and IP as inputs to their respective gates, and provide the differential pair of output signals QP and QN that have approximately one half the frequency as that of the input signals INP and INN. The output signals QP and QN are out of phase from the output signals IP and IN by approximately 90 degrees, and can be used as the input signals in a multi-stage divider instead of the output signals IP and IN. A gate of the transistor 353 is coupled to a drain of the transistor 354, which is also coupled to the output signal IN, and a gate of the transistor 354 is coupled to a drain of the transistor 353, which is also coupled to the output signal IP.

A bias network provides biasing to the inputs (i.e., gates) of the transistors 359 and 360. The bias network includes a power down transistor 390 which is coupled to ground via a resistor bridge including resistors 391 and 392. The power down transistor 390 receives at its gate a power down signal PD, and turns off and on responsive to the power down signal PD. A node between the resistors 391 and 392 is a bias node for supplying a bias voltage to the inputs (i.e., gates) of the input transistors 359 and 360 via resistors 393 and 394, respectively.

The resistor bank 302 includes four load resistor units, one for each of the four output signals, namely, IP, IN, QP and QN. A first load resistor unit is coupled between the divider voltage source VDD_DIV and the output signal IP, and includes resistors 322, 324, 326 and transistors 321, 323, which are P-channel transistors. The resistor 324 is coupled between the divider voltage source VDD_DIV and the output signal IP without any intervening switches (i.e., transistors). The resistors 322 and 326, however, are coupled to the divider voltage source VDD_DIV via the transistors 321 and 323, respectively. Sources of the transistors 321 and 323 are coupled to the divider voltage source VDD_DIV and one end of the resistor 324, and drains of the transistors 321 and 323 are respectively coupled to one end of the resistors 322 and 326.

Gates of the transistors 321 and 323 receive the band tuning bits B<1> and B<0>, respectively. Hence, depending on the states of the bits B<1> and B<0>, the resistance of the first load resistor unit is adjusted. By way of example, when B[0:1] is "11", the resistance of the first resistor unit would substantially be that of the resistor 324, since the high bits would turn off the P-channel transistors 321 and 323. This would result in the maximum resistance for the first load resistor unit since the resistors 322 and 326 have substantially no effect on the resistance. On the other hand, when B[0:1] is "00", the transistors 321 and 323 are turned on, and both the resistors 322 and 326 would be coupled in parallel with the resistor 324, thereby resulting in the minimum resistance for the first load resistor unit including the resistors 322, 324 and 326.

Since a small load resistance is desired for a high frequency operation and a high load resistance is desired for a low frequency operation, the band tuning bits B[0:1] of "11" would correspond to the minimum frequency of operation, and the band tuning bits B[0:1] of "00" would correspond to the maximum frequency of operation.

A second load resistor unit is coupled between the divider voltage source VDD_DIV and the output signal IN, and includes resistors 328, 330, 332 and transistors 329, 331, which are P-channel transistors. A third load resistor unit is coupled between the divider voltage source VDD_DIV and the output signal QP, and includes resistors 334, 336, 338 and transistors 335, 337, which are P-channel transistors. A fourth load resistor unit is coupled between the divider voltage source VDD_DIV and the output signal QN, and includes resistors 340, 342, 344 and transistors 341, 343, which are P-channel transistors.

Since the second, third and fourth load resistor units are configured in substantially the same way and operate in substantially the same manner as the first load resistor unit, they will not be separately described in detail. Each of the second, third and fourth load resistor units receive band tuning bits B<0> and B<1>, and adjusts its resistance in response to the values of these binary bits, where "00" corresponds to a high frequency operation and results in the minimum resistance for each of the load resistor units, and "11" corresponds to a low frequency operation and results in a maximum resistance for each of the load resistor units.

While only two band tuning bits B<0> and B<1> are provided for in the LO generator system of the described embodiments, in practice any number of bits can be used. By way of example, five (5) band tuning bits B[0:4] may be used to provide a more precise control of the load resistance during the operation of the divider across the frequency range. Of course, use of five (5) band tuning bits would require six (6) resistors in each load resistor unit, one of which is always connected between the VDD_DIV and the respective output signal, and five that are connected via respective switches (e.g., transistors).

The values of the resistors 322, 324 and 326 may be the same or different from each other, and the values of the resistors 328, 330 and 332 may be the same or different from each other. Further, the values of the resistors 334, 336 and 338 may be the same or different from each other, and the values of the resistors 340, 342 and 344 may be the same or different from each other.

The current stirring unit 306 receives the inverted band tuning bits $\overline{B<0>}$ and $\overline{B<1>}$ to adjust the amount of current it supplies based on the frequency of the input signal. While the same band tuning bits as the resistor bank 302 are inverted and used by the current stirring unit 306 in the described exemplary embodiment, a different set of bits and/or a different number of bits may be used by the current stirring unit in other embodiments as long as those bits are suitable and are indicative of the frequency of operation.

The current stirring unit 306 includes three pairs of N-channel transistors that are coupled between the latches and input device 304 and ground. A first pair of transistors includes a transistor 372 whose drain is coupled to the sources of the transistors 359 and 360 of the input device, and a gate receives the divider voltage source VDD_DIV. Since the gate of the transistor 372 is coupled to VDD_DIV, the transistor 372 is turned on during a normal operation as long as the VDD_DIV provides a suitable voltage. A source of the transistor 372 is coupled to a drain of a transistor 378 whose source is coupled to ground.

Second and third pairs of transistors respectively include transistors 374 and 376 whose drains are coupled to the sources of the transistors 359 and 360 of the input device, and gates respectively receive the inverted band tuning bits $\overline{B<1>}$ and $\overline{B<0>}$. Sources of the transistors 374 and 376 are respectively coupled to drains of transistors 380 and 382 whose sources are coupled to ground. Gates of all three transistors 378, 380 and 382 receive a divider bias voltage BIAS_DIV, and therefore, the transistors 378, 380 and 382 are turned on during a normal operation, as long as BIAS_DIV has a suitable voltage level.

Unlike the first pair of transistors 372 and 378 that continuously supplies current during the normal operation, the second pair of transistors 374 and 380, and the third pair of transistors 376 and 382 supply current depending on the states of the inverted band tuning bits $\overline{B<1>}$ and $\overline{B<0>}$. By way of example, when the band tuning bits B[0:1] are "11" (i.e., low frequency), and the inverted band turning bits $\overline{B[0:1]}$ are "00", both the transistors 374 and 376 are turned off. This way, current is saved without affecting performance since the divider poses less bottleneck problem at a lower frequency. On the other hand, when the band tuning bits B[0:1] are "00" (i.e., high frequency), and the inverted band turning bits $\overline{B[0:1]}$ are "11", both the transistors 374 and 376 are turned on to supply currents in addition to the current provided through the transistor 372. This way, speed requirements for a high frequency operation are satisfied.

It should be noted that the W/L ratio of the transistors 372, 374, 376, 378, 380 and 382 may be the same or different from each other to vary the amount of currents using different weights in each transistor. Further, the W/L ratio of each pair of transistors 372 and 378, 374 and 380, and 376 and 382 may be the same as each other, while the W/L ratio of the transistors in different pairs of transistors may be different from each other.

While only three pairs of transistors are used in the current stirring unit 306 of the described exemplary embodiment, the pairs of transistors used in other embodiments may be different. By way of example, five (5) inverted band tuning bits $\overline{B[0:4]}$ may be applied to five (5) pairs of transistors in a current stirring unit having six (6) pairs of transistors, where one of the pairs is applied a voltage from the divider voltage source VDD_DIV at one of its transistors.

While certain exemplary embodiments have been described above in detail and shown in the accompanying drawings, it is to be understood that such embodiments are merely illustrative of and not restrictive of the broad invention. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the spirit and scope of the present invention as defined by the appended claims and equivalents thereof.

I claim:

1. A divider for a local oscillator (LO) generator system, the divider having at least one divider unit, each divider unit comprising:
 a frequency divider unit adapted for receiving an input signal having an input frequency and for outputting an output signal having an output frequency which is approximately one half of the input frequency;
 a resistor bank coupled between a voltage source and the frequency divider unit; and
 a current stirring unit adapted for supplying current to the frequency divider unit,
 wherein a resistance of the resistor bank and a magnitude of the current supplied by the current stirring unit are adapted to be varied depending on the input frequency.

2. The divider of claim 1, wherein the at least one divider unit includes two divider units arranged in series, such that a first one of the divider units receives a signal having a first frequency as the input signal and outputs a signal having a second frequency, which is approximately one half of the first frequency, as the output signal, and a second one of the divider units receives the signal having the second frequency as the input signal, and outputs a signal having a third frequency, which is approximately one half of the second frequency, as the output signal.

3. The divider of claim 1, wherein the frequency divider unit comprises:
 an input device for receiving the input signal having the input frequency; and
 a latch coupled between the resistor bank and the input device for outputting the output signal having the output frequency.

4. The divider of claim 1, wherein the resistance of the resistor bank is adapted decrease as the input frequency increases, and is adapted to increase as the input frequency decreases.

5. The divider of claim 4, wherein the magnitude of the current supplied by the current stirring unit increases as the input frequency increases, and decreases as the input frequency decreases.

6. The divider of claim 1, wherein a control signal comprising a plurality of binary bits are provided to the resistor bank and the current stirring unit to control the resistance of the resistor bank and the magnitude of the current supplied by the current stirring unit.

7. The divider of claim 6, wherein each divider unit further comprises an inverter unit for inverting the binary bits prior to providing them to the current stirring unit.

8. The divider of claim 1, wherein the frequency divider unit is a differential divider for receiving the input signal comprising a differential pair of input signals, and for outputting the output signal comprising a differential pair of output signals.

9. The divider of claim 8, wherein the frequency divider unit further outputs another differential pair of output signals that are offset in phase from the differential pair of output signals by approximately 90 degrees.

10. A local oscillator (LO) generator system comprising:
 a voltage controlled oscillator (VCO) for generating an output corresponding to a control voltage applied thereto;
 a VCO buffer for receiving the output generated by the VCO and for providing a buffered output; and at least one divider, each divider having at least one divider unit, each divider unit comprising:
  a frequency divider unit adapted for receiving the buffered output as an input signal having an input frequency and for outputting an output signal having an output frequency which is approximately one half of the input frequency;
  a resistor bank coupled between a voltage source and the frequency divider unit; and
  a current stirring unit adapted for supplying current to the frequency divider unit, wherein a resistance of the resistor bank and a magnitude of the current supplied by the current stirring unit are adapted to vary depending on the input frequency.

11. The LO generator system of claim 10, wherein the at least one divider unit includes two divider units arranged in series, such that a first one of the divider units receives a signal having a first frequency as the input signal and outputs a signal having a second frequency, which is approximately one half of the first frequency, as the output signal, and a second one of the divider units receives the signal having the second frequency as the input signal, and outputs a signal having a third frequency, which is approximately one half of the second frequency, as the output signal.

12. The LO generator system of claim 10, wherein the frequency divider unit comprises:
an input device for receiving the input signal having the input frequency; and
a latch coupled between the resistor bank and the input device for outputting the output signal having the output frequency.

13. The LO generator system of claim 10, wherein the resistance of the resistor bank is adapted to decrease as the input frequency increases, and is adapted to increase as the input frequency decreases.

14. The LO generator system of claim 13, wherein the magnitude of the current supplied by the current stirring unit increases as the input frequency increases, and decreases as the input frequency decreases.

15. The LO generator system of claim 10, wherein a control signal comprising a plurality of binary bits are provided to the resistor bank and the current stirring unit to control the resistance of the resistor bank and the magnitude of the current supplied by the current stirring unit.

16. The LO generator system of claim 15, wherein each divider unit further comprises an inverter unit for inverting the binary bits prior to providing them to the current stirring unit.

17. The LO generator system of claim 10, wherein the frequency divider unit is a differential divider for receiving the input signal comprising a differential pair of input signals, and for outputting the output signal comprising a differential pair of output signals.

18. The LO generator system of claim 17, wherein the frequency divider unit further outputs another differential pair of output signals that are offset in phase from the differential pair of output signals by approximately 90 degrees.

19. In a divider of a local oscillator (LO) generator system, the divider having at least one divider unit, each divider unit comprising a frequency divider unit for receiving an input signal having an input frequency and for outputting an output signal having an output frequency which is approximately one half of the input frequency, a resistor bank coupled to the frequency divider unit, a current stirring unit for supplying current to the frequency divider unit, a method of improving bandwidth coverage, comprising:
adjusting a resistance of the resistor bank based on the input frequency; and
adjusting a magnitude of the current supplied by the current stirring unit based on the input frequency.

20. The method of claim 19, wherein adjusting the resistance of the resistor bank comprises decreasing the resistance of the resistor bank when the input frequency increases, and increasing the resistance of the resistor bank when the input frequency decreases.

21. The method of claim 20, wherein adjusting the magnitude of the current supplied by the current stirring unit comprises increasing the magnitude of the current when the input frequency increases, and decreasing the magnitude of the current when the input frequency decreases.

22. The method of claim 19, wherein adjusting resistance of the resistor bank and adjusting a magnitude of the current are performed by providing a control signal comprising a plurality of binary bits, which change states in accordance with the input frequency.

* * * * *